(12) United States Patent
Hasebe et al.

(10) Patent No.: US 6,313,047 B2
(45) Date of Patent: Nov. 6, 2001

(54) MOCVD METHOD OF TANTALUM OXIDE FILM

(75) Inventors: Kazuhide Hasebe; Yuichiro Morozumi; Dong-Kyun Choi; Takuya Sugawara, all of Nirasaki; Seiji Inumiya; Yoshitaka Tsunashima, both of Yokohama, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/811,451

(22) Filed: Mar. 20, 2001

(30) Foreign Application Priority Data

Mar. 22, 2000 (JP) .................................................. 12-080904
Dec. 5, 2000 (JP) .................................................. 12-370667

(51) Int. Cl.$^7$ ........................ H01L 21/31; H01L 21/469; H01L 21/44
(52) U.S. Cl. ........................ 438/785; 438/761; 438/681; 438/685
(58) Field of Search ..................... 438/785, 681, 438/685, 761

(56) References Cited

U.S. PATENT DOCUMENTS

| | | | |
|---|---|---|---|
| 5,663,088 | * | 9/1997 | Sandhu et al. ...................... 438/396 |
| 6,017,789 | * | 1/2000 | Sandhu et al. ...................... 438/240 |
| 6,204,203 | * | 3/2001 | Paranjpe et al. .................... 438/785 |
| 6,204,204 | * | 3/2001 | Narwankar et al. ................. 438/785 |
| 6,218,300 | * | 4/2001 | Narwankar et al. ................. 438/685 |
| 6,232,248 | * | 5/2001 | Shinriki et al. ..................... 438/785 |

* cited by examiner

*Primary Examiner*—Alexander G. Ghyka
(74) *Attorney, Agent, or Firm*—Oblon, Spivak, McClelland, Maier & Neustadt, P.C.

(57) ABSTRACT

Disclosed is an MOCVD method of forming a tantalum oxide film. First, water vapor used as an oxidizing agent is supplied into a process container to cause moisture to be adsorbed on a surface of each semiconductor wafer. Then, PET gas used as a raw material gas is supplied into the process container and is caused to react with the moisture on the wafer at a process temperature of 200° C., thereby forming an interface layer of tantalum oxide. Then, PET gas and oxygen gas are supplied into the process container at the same time, and are caused to react with each other at a process temperature of 410° C., thereby forming a main layer of tantalum oxide on the interface layer.

22 Claims, 7 Drawing Sheets

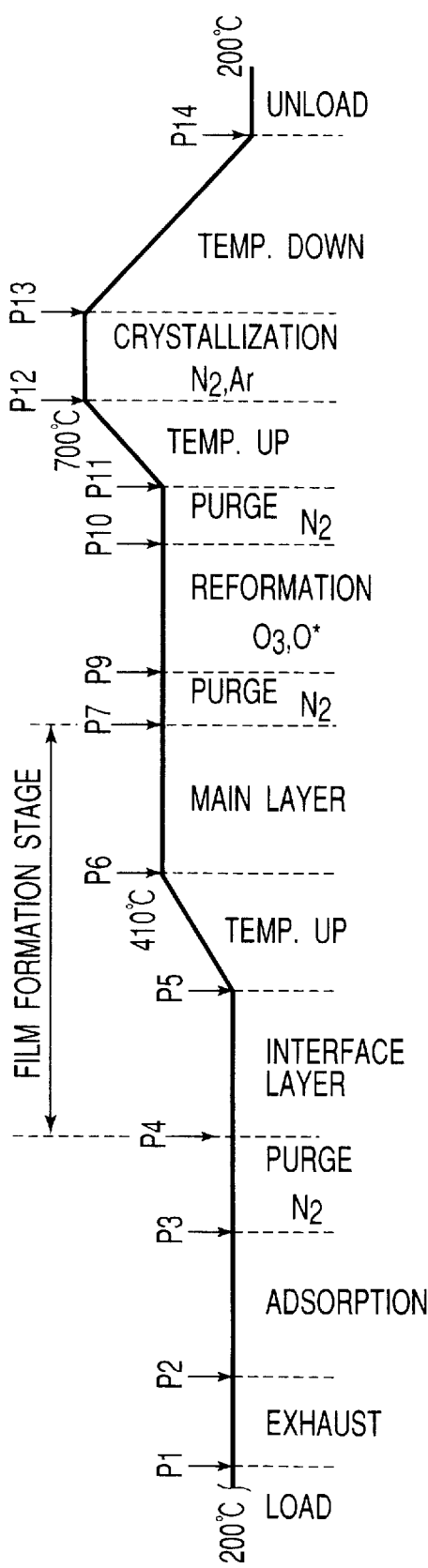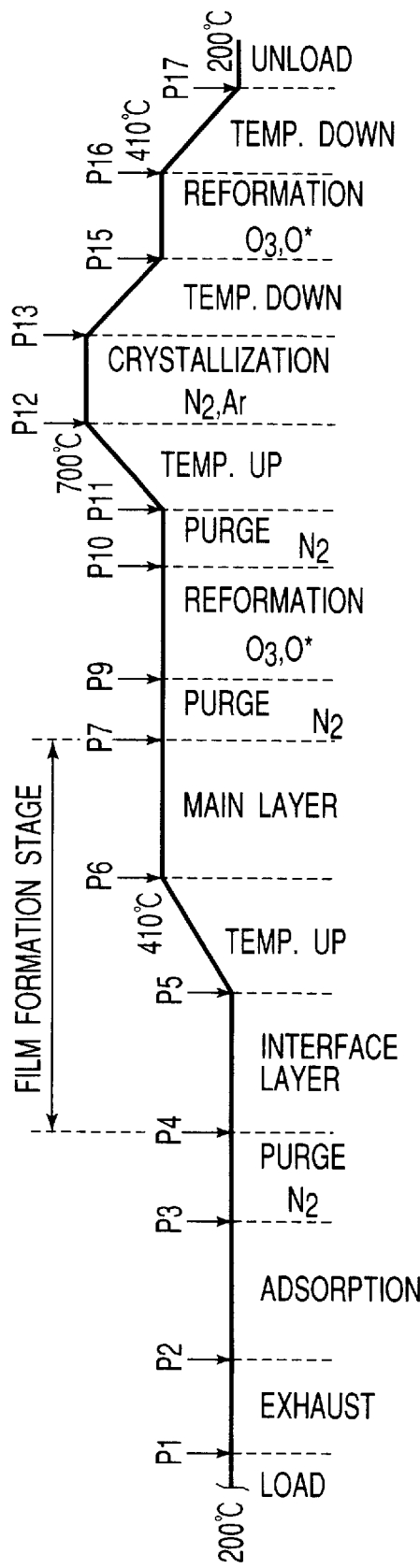

MOCVD METHOD OF TANTALUM OXIDE FILM

CROSS-REFERENCE TO RELATED APPLICATIONS

This application is based upon and claims the benefit of priority from the prior Japanese Patent Applications No. 2000-080904, filed Mar. 22, 2000; and No. 2000-370667, Dec. 5, 2000, the entire contents of both of which are incorporated herein by reference.

BACKGROUND OF THE INVENTION

The present invention relates to an MOCVD (Metal Organic Chemical Vapor Deposition) method of a tantalum oxide film in a semiconductor processing system, and more specifically to a technique of forming, e.g., a gate insulating film, capacitor insulating, or the like of a semiconductor device. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD (Liquid Crystal Display) substrate, by forming semiconductor layers, insulating layers, and conductive layers in predetermined patterns on the target substrate.

In order to manufacture semiconductor devices, film formation and pattern etching are repeatedly applied to a semiconductor wafer. As semiconductor devices are becoming more and more highly miniaturized and integrated, demands on film formation have become stricter. For example, very thin insulating films, such as capacitor insulating films and gate insulating films are still required to be thinner and to be more insulating.

Conventionally, silicon oxide films and silicon nitride films are used as the insulating films. In recent years, however, it has been proposed to form the insulating films from materials having even higher insulating properties, such as a metal oxide, e.g., tantalum oxide ($Ta_2O_5$). The film of this material can be formed by means of MOCVD, i.e., using a vaporized metal organic compound.

To form a tantalum oxide film by means of MOCVD, a metal (tantalum) alkoxide, such as $Ta(OC_2H_5)_5$ (pentoethoxytantalum: PET) is used as a raw material liquid. The raw material liquid is made to bubble by e.g., nitrogen gas, or vaporized by a vaporizer set at a vaporizing temperature, to be in a gaseous state, and is supplied to a process chamber preset to have a vacuum atmosphere. At the same time, an oxidizing gas, such as oxygen, is supplied to the process chamber. The supplied raw material is decomposed to offer a film forming material on the surface of a semiconductor wafer heated to a predetermined process temperature. With this film forming material, a tantalum oxide ($Ta_2O_5$) film is formed on the surface of the semiconductor wafer by means of deposition.

As semiconductor device design rules have become stricter, the required thickness of tantalum oxide films is now about 10 nm at max. Tantalum oxide films grow at a deposition rate of about 150 nm/min when a deposition temperature is about 600° C. Accordingly, where tantalum oxide films having a thickness of about 10 nm have to be formed with high accuracy, a low deposition temperature of about 400° C. is used to reduce the deposition rate. In the case of using such conditions for forming tantalum oxide films, however, the present inventors have found a problem in that the surface of the tantalum oxide films becomes uneven, i.e., the degree of surface roughness is higher and the surface morphology is degraded, thereby deteriorating the electric properties of the film.

BRIEF SUMMARY OF THE INVENTION

An object of the present invention is to provide an MOCVD method, which allows a thin tantalum oxide film to be formed with high controllability in the film thickness, and to have excellent electric properties.

According to a first aspect of the present invention, there is provided an MOCVD method of forming a tantalum oxide film on a target substrate in an airtight process container of a semiconductor processing system, comprising:

a step of preparing first and second materials consisting essentially of one and the other, respectively, of an oxidizing agent and an organic tantalum, and third and fourth materials consisting essentially of one and the other, respectively, of an oxidizing agent and an organic tantalum;

an adsorption step of forming a state where the first material is adsorbed on a surface of the target substrate placed in the process container;

a first layer formation step of supplying the second material in a gaseous state into the process container, and causing the first material adsorbed on the surface of the target substrate and the second material to react with each other, thereby forming a first layer consisting essentially of tantalum oxide on the target substrate, wherein the target substrate is set at a temperature of from 200 to 350° C. in the first layer formation step; and a second layer formation step, after the first layer formation step, of supplying the third and fourth materials in gaseous states into the process container, and causing the third and fourth materials to react with each other on the target substrate, thereby forming a second layer consisting essentially of tantalum oxide on the first layer, so that the tantalum oxide film comprises first and second layers.

According to a second aspect of the present invention, there is provided an MOCVD method of forming a tantalum oxide film on a target substrate in an airtight process container of a semiconductor processing system, comprising:

a step of preparing first and second materials consisting essentially of one and the other, respectively, of an oxidizing agent and an organic tantalum, and third and fourth materials consisting essentially of one and the other, respectively, of an oxidizing agent and an organic tantalum;

an adsorption step of supplying the first material in a gaseous state into the process container to cause the first material to be adsorbed on a surface of the target substrate;

a purge step of purging the process container with an inactive gas after the adsorption step to remove the first material from an atmosphere in the process container;

a first layer formation step, after the purge step, of supplying the second material in a gaseous state into the process container, and causing the first material adsorbed on the surface of the target substrate and the second material to react with each other, thereby forming a first layer consisting essentially of tantalum oxide on the target substrate, wherein the target substrate is set at a temperature of from 200 to 350° C. in the first layer formation step; and a second layer formation step, after the first layer formation step, of supplying the third and fourth materials in gaseous states into the process container, and causing the third and fourth materials to react with each other on the target substrate, thereby forming a second layer consisting essentially of tantalum oxide on the first layer, so that the tantalum oxide film comprises first and second layers, wherein the third and fourth materials are supplied into the process container at substantially the same time from nozzles independent of each other, in the second layer formation step.

In a preferable manner of first and second aspects, the oxidizing agent used as one of the third and fourth materials has an oxidizing power lower than that of the oxidizing agent used as one of the first and second materials, the organic tantalum used as the other of the third and fourth materials is the substantially the same material as the organic tantalum used as the other of the first and second materials, and the target substrate is set at a temperature of from 350 to 500° C. in the second layer formation step.

As the organic tantalum, PET (pentoethoxytantalum), i.e., $Ta(OC_2H_5)_5$, may be used.

The oxidizing agent used as one of the first and second materials may be selected from the group consisting of $H_2O$, $H_2O_2$, $O_3$, oxygen radical, a mixture of $H_2$ and $O_2$, a mixture of $H_2$ and $N_2O$, a mixture of $H_2$ and NO, a mixture of $NH_3$ and $O_2$, and a mixture of $O_3$ and $H_2$.

The oxidizing agent used as one of the third and fourth materials may be selected from the group consisting of $O_2$, $O_3$, and $H_2O$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a time chart showing an MOCVD method of a tantalum oxide film according to a fifth embodiment of the present invention;

FIG. 8 is a time chart showing an MOCVD method of a tantalum oxide film according to a sixth embodiment of the present invention;

DETAILED DESCRIPTION OF THE INVENTION

In the process of developing the present invention, the present inventors conducted research on mechanisms as to why the degree of surface roughness is higher and the surface morphology is degraded, in tantalum oxide films grown at a low deposition temperature of about 400° C. As a result, the present inventors have arrived at the finding given below.

Figure 11:
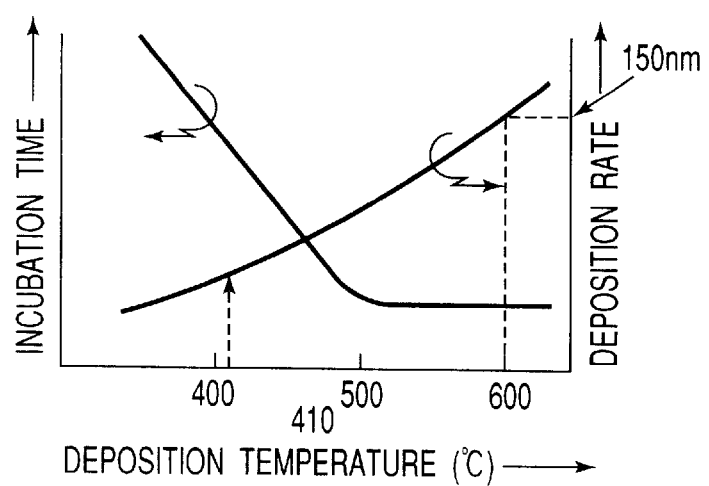
FIG. 11 is a graph showing the relationship between the deposition rate of tantalum oxide films and an incubation time.

FIG. 11 is a graph showing the relationship between the deposition rate of tantalum oxide films and an incubation time. The incubation time is a period of time at the initial phase of a film formation step, in which no intended film (tantalum oxide film) is deposited even though an organic tantalum gas and an oxidizing gas are supplied. AS shown in FIG. 11, the deposition rate of tantalum oxide films and the incubation time are contrary to each other, in terms of the deposition temperature. Specifically, if the deposition temperature is lowered, the deposition rate is reduced to improve the controllability in the film thickness, while the incubation time is increased.

Figure 12A:
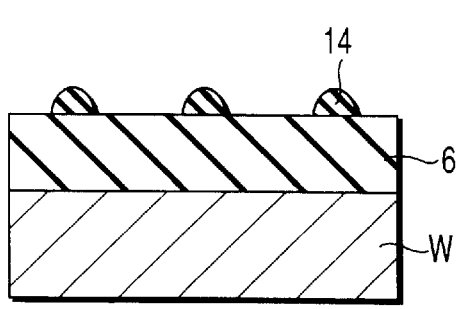
FIGS. 12A and 12B are sectional views showing steps of a conventional MOCVD method of a tantalum oxide film.
Figure 12B:
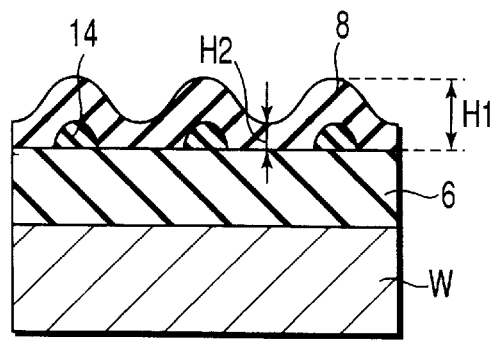

FIGS. 12A and 12B are sectional views showing steps of a conventional MOCVD method of a tantalum oxide film.

As shown in FIG. 12A, an underlying layer 6 is disposed on the surface of a semiconductor wafer W of, e.g., silicon. The underlying layer 6 consists essentially of any one of silicon oxide (SiOx), silicon nitride (SiNx), and a mixture of them (SiOxNy). The underlying layer 6 is used to cause a tantalum oxide film thereon to have an interface level density falling in a certain range and to match with the silicon surface.

During the incubation period, $Ta_2O_5$ seeds 14 in an amorphous state are dispersively formed on the surface of the underlying layer 6 of the wafer W, as shown in FIG. 12A. After the incubation period, a film suddenly starts growing from the seeds 14, and results in a tantalum oxide film 8, as shown in FIG. 12B. The tantalum oxide film 8 thus formed has a very uneven surface with projections and recesses, which reflect the projecting state of separated seeds 14. Since the size of the seeds 14 becomes larger essentially in proportion to an increase in the incubation time, a low deposition temperature of about 400° C. for forming the tantalum oxide film 8 increases the degree of surface roughness.

An unevenness of the surface means that the tantalum oxide film 8 has a thicker portion and a thinner portion. For example, the thicker portion may have a thickness H1 of about 10 nm, while the thinner portion may have a thickness H2 of about 3 nm. Where such an uneven film is applied to a gate insulating film or a capacitor insulating film in a semiconductor device, an electrical field concentration is caused at the thinner portion, thereby generating a leakage current far lager than the designed value.

Figure 13A:
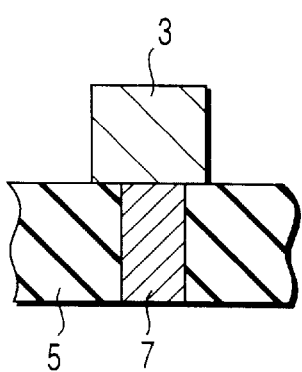
FIGS. 13A, 13B, and 13C are sectional views showing steps of forming the insulating film of tantalum oxide of a capacitor, which has an MIM structure, by a conventional MOCVD method.
Figure 13B:
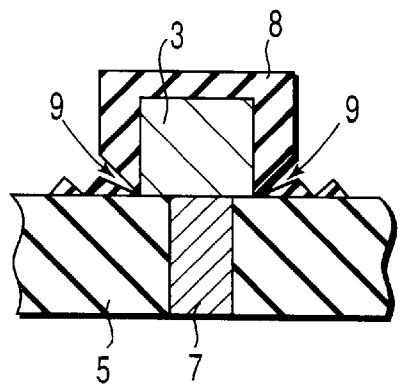
Figure 13C:
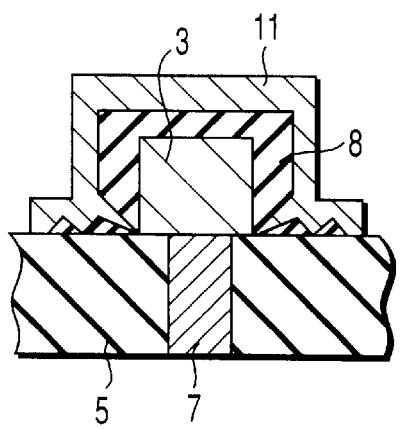

FIGS. 13A, 13B, and 13C are sectional views showing steps of forming the insulating film of tantalum oxide of a capacitor, which has an MIM structure, by a conventional MOCVD method.

As shown in FIG. 13A, a lower electrode 3 made of, e.g., ruthenium (Ru), of the capacitor is disposed on an inter-level insulating film 5 made of, e.g., $SiO_2$. The lower electrode 3 is connected to a diffusion layer (not show) below it by a plug 7 made of, e.g., tungsten. The lower electrode 3 may have a structure including a doped polycrystalline silicon layer and an SiN film deposited thereon as a reaction-preventing layer.

As shown in FIG. 13B, a tantalum oxide film 8 used as a capacitor insulating film is deposited on the lower electrode 3 and the inter-level insulating film 5. When the tantalum oxide film 8 is formed, there is substantially no time lag in stating the deposition on the lower electrode 3 of ruthenium. On the other hand, at this time, there is caused a time lag of about seven minutes at most on the inter-level insulating film 5 of $SiO_2$, due to an incubation time as described above. The tantalum oxide film 8 starts growing from several islands, and thus becomes partly thin. Particularly, recesses 9 are formed in the tantalum oxide film 8 at the boundary between the lower electrode 3 and the inter-level insulating film 5.

As shown in FIG. 13C, an upper electrode 11 made of, e.g., ruthenium, of the capacitor is formed on the tantalum oxide film 8, and the recesses 9 are filled with the material of the upper electrode 11. When a voltage is applied between the electrodes 3 and 11 of this resultant device, an electrical field concentration is caused at the recesses 9, thereby deteriorating the electric characteristics of the device.

Embodiments of the present invention, made on the basis of the above-described findings, will be described hereinafter with reference to the accompanying drawings. In the following description, the constituent elements having substantially the same function and arrangement are denoted by the same reference numerals, and a repetitive description will be made only when necessary.

Figure 1:
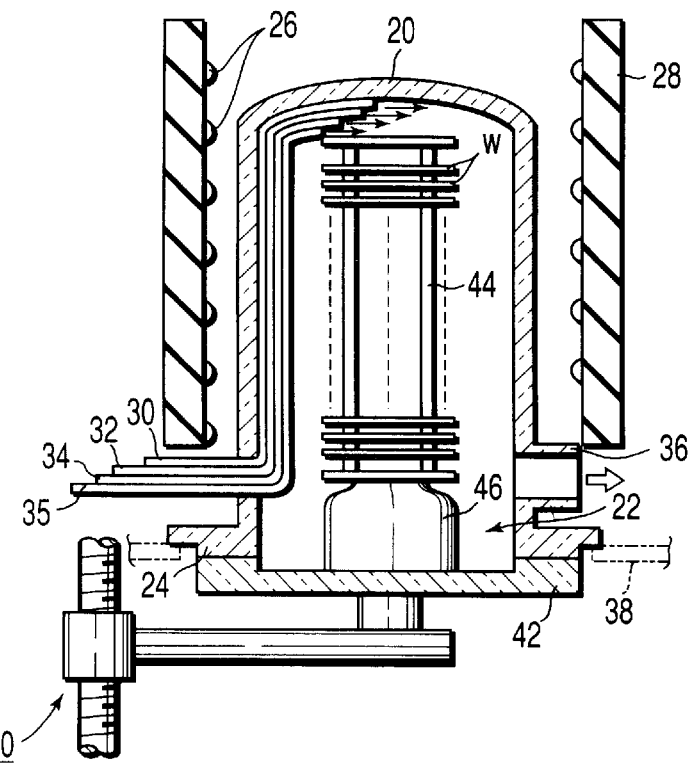
FIG. 1 is a sectional view showing a vertical MOCVD apparatus of the batch type according to an embodiment of the present invention.

FIG. 1 is a sectional view showing a vertical MOCVD apparatus of the batch type according to an embodiment of the present invention.

As shown in FIG. 1, the MOCVD apparatus includes a process container or process chamber 20 made of quartz and having a cylindrical shape with a ceiling. The process container or process chamber 20 has an opening 22 at the bottom, around which a flange 24 for connection is formed. The process container 20 is surrounded by a cylindrical insulating body 28, which is provided with heating means, such as a heater 26, thereby constituting a furnace.

Four nozzles 30, 32, 34, and 35 are disposed to penetrate a lower portion of the sidewall of the process container 20. The nozzle 30 is used for introducing a raw material gas. The nozzle 32 is used for introducing an oxidizing agent and a reforming gas. The nozzle 34 is used for introducing oxygen gas as another oxidizing agent. The nozzle 35 is used for selectively introducing $N_2$ gas and Ar gas, which are inactive gases. The nozzles 30, 32, 34, and 35 extend along the sidewall of the process container 20 up to the ceiling, where the nozzles spout respective gasses at controlled flow rates.

In an MOCVD method of a tantalum oxide film according to a first embodiment of the present invention, the raw material gas or film formation gas consists of an organic tantalum, such as PET (pentoethoxytantalum), i.e., $Ta(OC_2H_5)_5$, while the oxidizing agent consists of water vapor, i.e., $H_2O$.

An exhaust port 36 having a relatively large diameter is formed in a lower portion of the sidewall of the process container 20, for exhausting the atmosphere inside the process container 20. The exhaust port 36 is connected to an exhaust section including an exhaust pump (not shown). The flange 24 of the process container 20 is supported by a base plate 38 made of, e.g., stainless steel, so that the whole process container 20 is supported.

The opening 22 at the bottom of the process container 20 is opened and closed by a cap 42 made of quartz, which is moved up and down by an elevating mechanism 40, such as a boat elevator. A wafer boat 44 made of quartz is mounted via an insulating cylinder 46 on the cap 42, and supports a number of semiconductor wafers W such that they are stacked in a vertical direction at regular intervals therebetween. For example, 50 to 100 wafers of 8 inch-size are carried on the wafer boat 44. The wafer boat 44 is loaded and unloaded to and from the process container 20 by the cap 42 being moved up and down.

An explanation will be given, with reference to FIGS. 1 to 3C, of an MOCVD method of a tantalum oxide film according to the first embodiment of the present invention, performed in the MOCVD apparatus described above.

At first, unprocessed semiconductor wafers W of, e.g., silicon, are stacked on the wafer boat 44 mounted on the cap 42, which has been lowered from the process container 20 by the elevating mechanism 40. At this time, the wafers W already have respective underlying layers 6 formed in advance, as shown in FIGS. 12A and 12B. The underlying layers 6 substantially consist of any one of silicon oxide (SiOx), silicon nitride (SiNx), and a mixture of them (SiOxNy). Then, the cap 42 is moved up, so that the wafer boat 44 supporting the wafers W is loaded into the process container 20 though the opening 22, which is finally closed by the cap 42 to airtightly seal the process container (a time point P1 in FIG. 2).

Figure 3A:
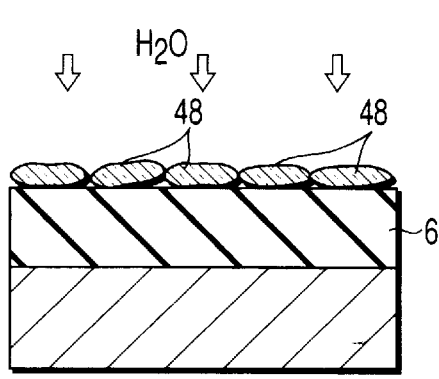
FIGS. 3A, 3B, and 3C are sectional views showing steps of an MOCVD method of a tantalum oxide film according to the first embodiment of the present invention.

Then, the process container 20 is vacuum-exhausted and kept at a predetermined pressure of, e.g., 133 Pa (1 Torr), while the wafers S is kept at a temperature of about 200° C. (a time point P2). Under these conditions, an oxidizing agent adsorption step is performed. In the oxidizing agent adsorption step, a predetermined amount of oxidizing agent, such as about 100 sccm of water vapor, is supplied through the nozzle 32. The water vapor is generated by burning $H_2$ gas with $O_2$ gas in a combustion chamber (not shown). Upon supply of the water vapor, very small water drops 48 substantially uniformly stick to all over the surface of the underlying layer 6 of each wafer W (a time point P3), as shown in FIG. 3A.

The oxidizing agent adsorption step is performed up to the time point P3 for a period of time of, e.g., from 0.1 seconds to 30 minutes, preferably of from 30 seconds to 20 minutes. During this period, for example, a temperature of 200° C. and a pressure of 133 Pa, as described above, are maintained. This temperature is selected for the adsorbed water drops not to be dissociated from the wafer surface, in consideration of the fact that the peak value of the dissociation is at a temperature near 300° C. This temperature is also selected to reduce the time needed to raise the temperature up to the following main layer formation temperature. Specifically, the temperature in the oxidizing agent adsorption step is set to be in a range of from 200 to 350° C., preferably of from 200 to 300° C., and, for example, at 200° C.

Figure 3B:
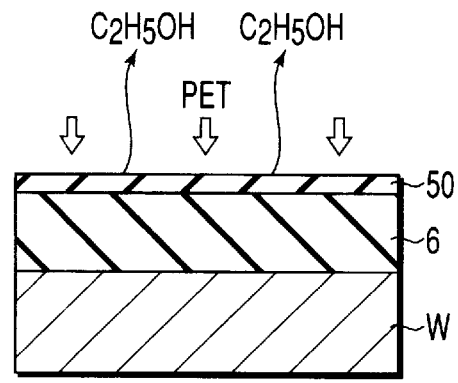

When the oxidizing agent adsorption step is finished, the supply of the water vapor is stopped. Then, $N_2$ gas is supplied into the process container 20, or the $N_2$ gas supply and exhaustion are repeated several times, so that the water vapor left in the atmosphere of the process container 20 is removed. After the $N_2$ gas purge (a time point P4) is finished, an interface layer formation step is performed. In the interface layer formation step, a predetermined amount of PET gas is supplied with an inactive gas, such as $N_2$ gas, used as a carrier gas, up to a time point P5. The PET gas comes into contact with the water drops 48 which have been adsorbed on the surface of each wafer W. Consequently, the PET gas is activated and is easily decomposed even at a low temperature of about 200° C. As a result, as shown in FIG. 3B, an interface layer 50 consisting of tantalum oxide ($Ta_2O_5$) is formed to have a thickness corresponding to several molecules (about 0.1 nm). The reaction at this time is represented by the following reaction formula, and produces an alcohol ($C_2H_5OH$).

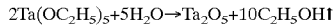
$$2Ta(OC_2H_5)_5 + 5H_2O \rightarrow Ta_2O_5 + 10C_2H_5OH\uparrow$$

During this step, process conditions are as follows: The flow rates of the PET gas and $N_2$ gas are set at about 0.05 ml/min and about 1000 sccm, respectively. The pressure in the process container 20 is set to be in a range of from 0.133 Pa (0.001 Torr) to 13300 Pa (100 Torr), preferably of from 13.3 to 133 Pa, and, for example, at 40 Pa. The temperature of the wafers W is set to be in a range of from 200 to 350° C., preferably of from 200 to 300° C. and, for example, at 200° C. This process is performed for a period of time of from 10 seconds to 30 minutes, preferably of from 30 seconds to 20 minutes. As a result, substantially all the water drops 48 are consumed to form the interface layer 50. In the first embodiment, the thickness of the interface layer 50 is set to be in a range of from 0.1 to 2.0 nm, preferably of from 0.1 to 1.0 nm, and, for example, at about 0.5 nm.

Figure 3C:
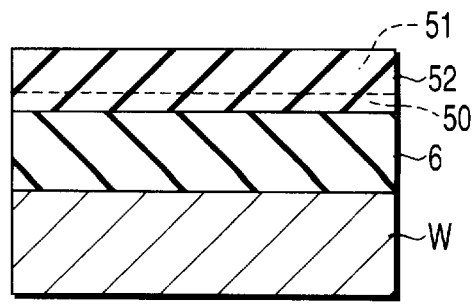

After the interface layer formation step is finished (the time point P5), the temperature of the wafers W is raised to, e.g., 410° C. (a time point P6) to increase the deposition rate, and then a main layer formation step is performed. In the main layer formation step, PET gas and $O_2$ gas are supplied under such a high process temperature, so that a main layer 51 consisting of tantalum oxide ($Ta_2O_5$) is formed with a deposition rate higher than that in the interface layer formation step, as shown in FIG. 3C. Note that, however, the oxidizing agent used in the main layer formation step, e.g., $O_2$, has an oxidizing power lower than that of the oxidizing agent used in the interface layer formation step, e.g., $H_2O$. The reaction at this time is represented by the following reaction formula.

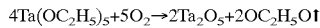
$$4Ta(OC_2H_5)_5 + 5O_2 \rightarrow 2Ta_2O_5 + 2OC_2H_5O\uparrow$$

During this step, process conditions are as follows: The flow rates of the PET gas and $O_2$ gas are set at a value of from about 0.05 to 5.0 ml/min and about 1000 sccm, respectively. The pressure in the process container 20 is set to be in a range of from 1.33 Pa (0.01 Torr) to 665 Pa (5 Torr), preferably of from 13.3 to 133 Pa, and, for example, at 40 Pa. The temperature of the wafers W is set to be in a range of from 350 to 500° C., preferably of from 350 to 450° C., and, for example, at 410°° C. The main layer formation step is performed up to a time point P7, e.g., for 600 seconds, to form a tantalum oxide film 52 having a total thickness of about 10 nm.

After the main layer formation step is finished (the time point P7), the temperature of the wafers W is lowered to a predetermined handling temperature (a time point P8). Then, the pressure in the process container 20 is returned to the atmospheric pressure, and the wafer boat 44 along with the wafers W is unloaded from the process container 20.

As described above, the interface layer formation layer step is performed before the main layer formation step, to form the interface layer 50 consisting of $Ta_2O_5$ and having a thin and uniform thickness. Thanks to the interface layer 50, the main layer 51 consisting of $Ta_2O_5$ is uniformly deposited on the wafer surface not to bring about an uneven thickness. In the main layer formation step, the process temperature is not so high, and thus the deposition rate is not so high. Accordingly, it is possible to form the tantalum oxide film 52 having a thickness as thin as about 10 nm, with high controllability and high planar uniformity in the film thickness, and without making the surface uneven.

In the first embodiment, the oxidizing agent adsorption step from the time point P2 to the time point P3, the $N_2$ purge step from the time point P3 to the time point P4, and the interface layer formation layer step from the time point P4 to the time point P5 are sequentially performed only once. The sequential steps from the time point P2 to the time point P5 may be repeated a plurality of times in this order to ensure the formation of the interface layer 50. For example, the steps of P2–P5 may be sequentially repeated five times, and followed by the temperature raising step from the time point P5 to the time point P6. When returning back from the time point P5 to the time point P2 in this case, the process container 20 may be $N_2$-purged and/or vacuum-exhausted (not shown).

The process conditions of the first embodiment, such as the gas flow rates, temperatures, and pressures, are only examples, but may be changed. The first embodiment employs water vapor ($H_2O$) in the oxidizing agent adsorption step as the oxidizing agent for forming the interface layer 50, but may employ another oxidizing agent for this purpose. The oxidizing agent used in the oxidizing agent adsorption step may be selected from the group consisting of $H_2O$, $H_2O_2$, $O_3$, oxygen radical (O*), a mixture of $H_2$ and $O_2$, a mixture of $H_2$ and $N_2O$, a mixture of $H_2$ and NO, a mixture of $NH_3$ and $O_2$, and a mixture of $O_3$ and $H_2$. Furthermore, the first embodiment employs $O_2$ as the oxidizing agent for forming the main layer 51, but may employ another oxidizing agent for this purpose. The oxidizing agent used in the main layer formation step may be selected from the group consisting of $O_2$, $O_3$, and $H_2O$.

When the oxidizing agent used in the oxidizing agent adsorption step is hydrogen peroxide ($H_2O_2$), very small liquid drops of hydrogen peroxide uniformly stick to all over the wafer surface, as the wafer drops 48 do in FIG. 3A. The adsorbed liquid drops of hydrogen peroxide uniformly react with PET to form a thin interface layer 50 having a uniform thickness (see FIG. 3B).

Figure 4:
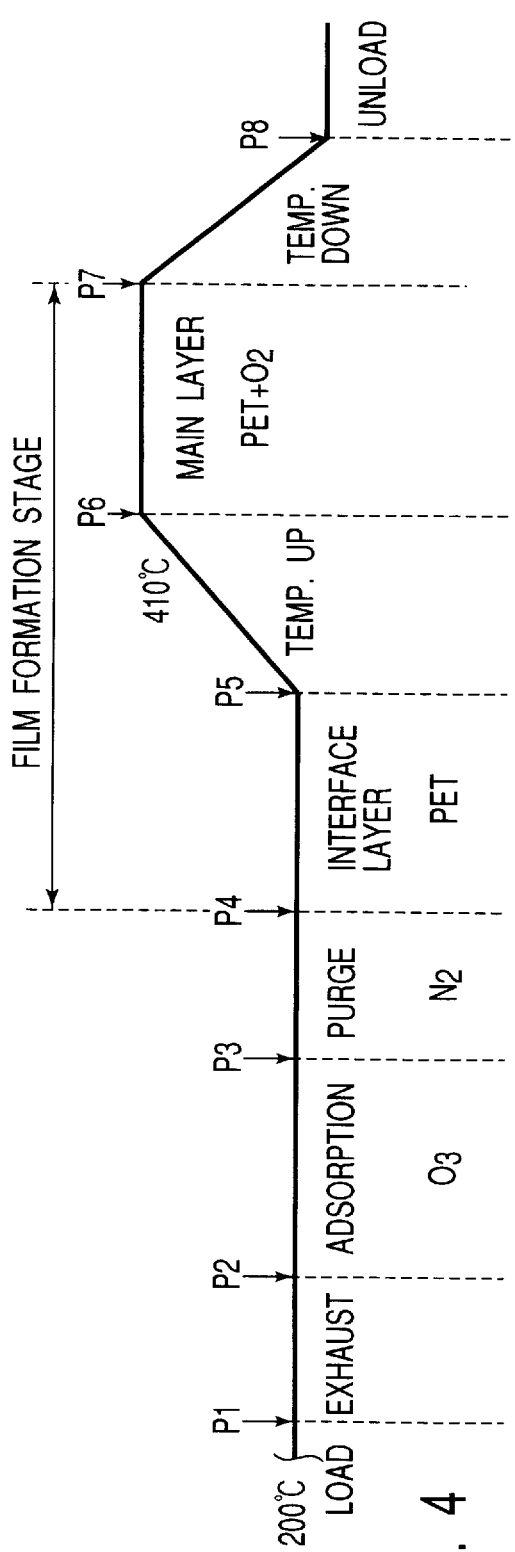
FIG. 4 is a time chart showing an MOCVD method of a tantalum oxide film according to a second embodiment of the present invention.

FIG. 4 is a time chart showing an MOCVD method of a tantalum oxide film according to a second embodiment of the present invention. The second embodiment differs from the first embodiment in that ozone is used as an oxidizing agent in an oxidizing agent adsorption step. Specifically, in the second embodiment, ozone is supplied into the process container 20 accommodating the wafers W to form an ozone atmosphere in the container 20 in the oxidizing agent adsorption step between time points P2 and P3. The time chart shown in FIG. 4 is the same as that shown in FIG. 2 except that ozone is supplied instead of $H_2O$ between the time points P2 and P3.

According to the second embodiment, ozone molecules uniformly stick to the wafer surface in the oxidizing agent adsorption step. After this step, $N_2$ purge is conducted to remove remaining ozone (the time point P3), and then PET gas is supplied. In this step, the ozone reacts with PET to form a thin interface layer 50 of $Ta_2O_5$ having a uniform thickness (see FIG. 3B). Accordingly, the second embodiment provides the same effect as the first embodiment. Also in the second embodiment, the sequential steps from the time point P2 to a time point P5 may be repeated a plurality of times in this order.

Figure 2:
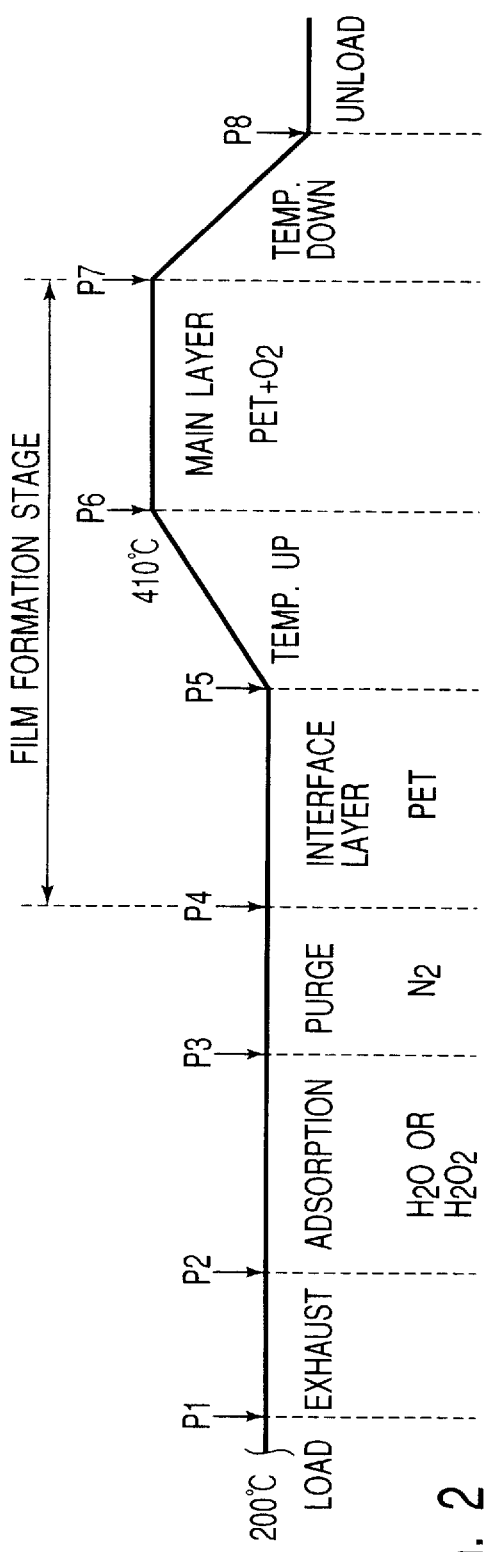
FIG. 2 is a time chart showing an MOCVD method of a tantalum oxide film according to a first embodiment of the present invention.
Figure 5:
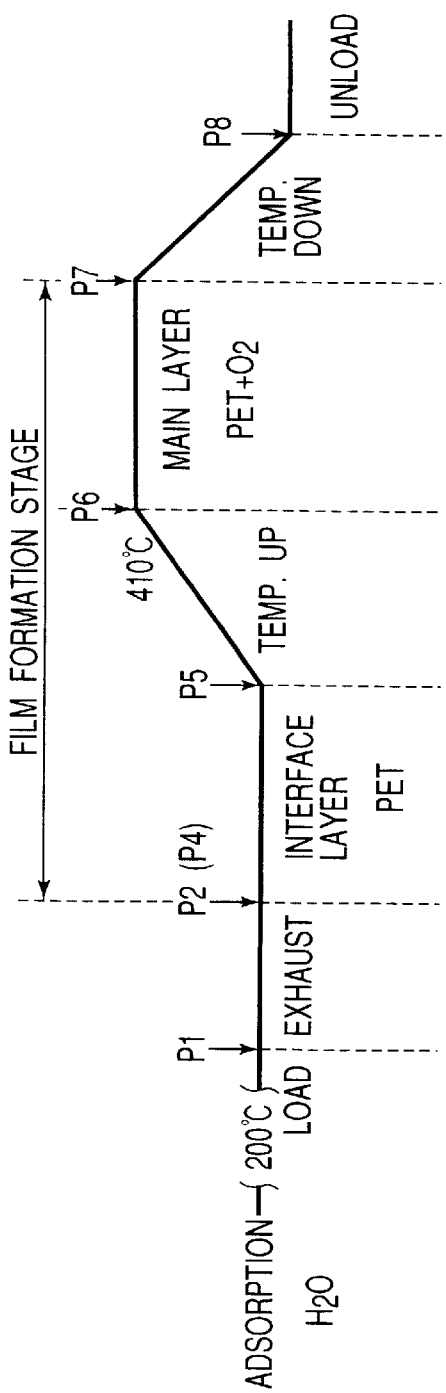
FIG. 5 is a time chart showing an MOCVD method of a tantalum oxide film according to a third embodiment of the present invention.

FIG. 5 is a time chart showing an MOCVD method of a tantalum oxide film according to a third embodiment of the present invention. The third embodiment differs from the first embodiment in that an oxidizing agent adsorption step is performed before wafers W are loaded into the process container 20. Specifically, in the third embodiment, the wafers W are supplied with moisture in advance, and are then loaded into the process container 20. In this case, since moisture already sticks to the wafer surface, PET can start being supplied to perform an interface layer formation step immediately after vacuum evacuation of the process container 20 is finished at a time point P2 (=a time point P4). For example, a washing step of washing the wafers with water, which is conducted before the wafers are loaded into the process container 20, can be used to perform the oxidizing agent adsorption step. In this case, the period of time between the time points P2 and P4 in FIG. 2 is omitted, thereby improving the throughput.

Figure 6:
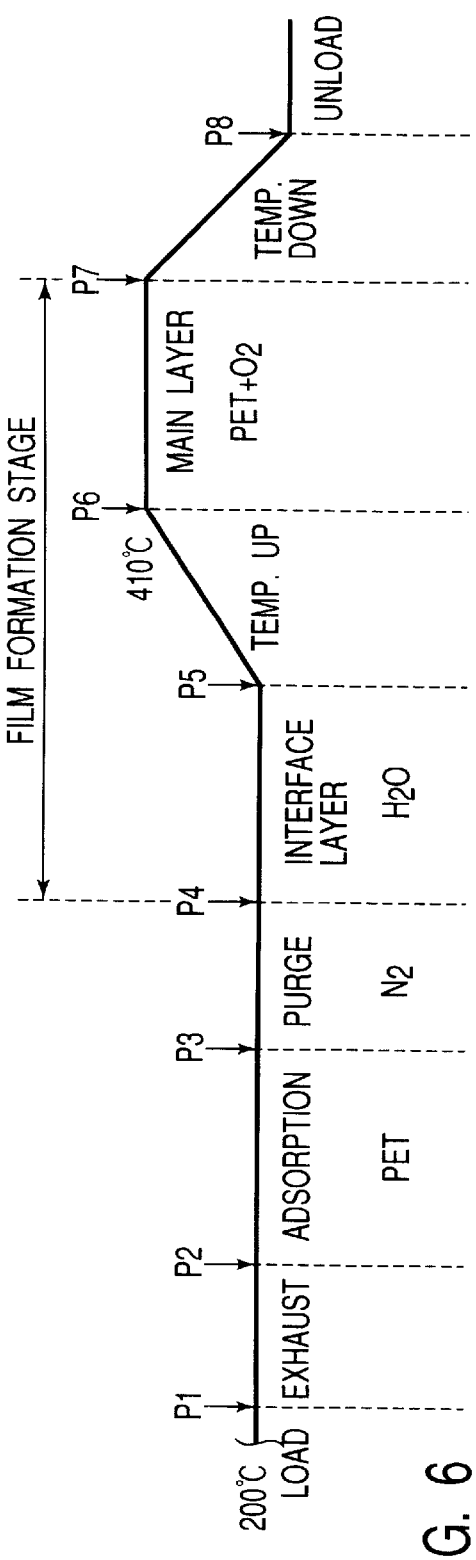
FIG. 6 is a time chart showing an MOCVD method of a tantalum oxide film according to a fourth embodiment of the present invention.

FIG. 6 is a time chart showing an MOCVD method of a tantalum oxide film according to a fourth embodiment of the present invention. The fourth embodiment is characterized in that the order of supplying a raw material gas and an oxidizing gas is reverse to that of the first embodiment. In the fourth embodiment, PET gas used as the raw material gas is first supplied into the process container 20 between time points P2 and P3 to perform a raw material gas adsorption step. The oxidizing agent, such as water vapor ($H_2O$), is then supplied into the process container 20 between time points P4 and P5 to perform an interface layer formation step. The time chart shown in FIG. 6 is the same as that shown in FIG. 2 except that the order of supplying the gases is reversed.

According to the fourth embodiment, PET gas supplied between the time points P2 and P3 uniformly sticks to all over the wafer surface. The adsorbed PET gas is oxidized by the oxidizing agent supplied between the time points P4 and P5 to form a thin interface layer having a uniform thickness. Accordingly, also in the fourth embodiment, it is possible to form the tantalum oxide film 52 having a thickness as thin as about 10 nm, with high controllability and high planar uniformity in the film thickness, and without making the surface uneven. Furthermore, also in the fourth embodiment, the sequential steps from the time point P2 to the time point P5 may be repeated a plurality of times in this order.

According to the first to fourth embodiments, the process temperature in the main layer formation step is set higher than those in the oxidizing agent adsorption step or raw material gas adsorption step, and the interface layer formation step. However, by appropriately selecting a raw material gas and an oxidizing agent, the process temperatures in the oxidizing agent adsorption step or raw material gas adsorption step, and the interface layer formation step may be set at the same as that in the main layer formation step. In this case, the temperature raising operation therebetween, i.e., between the time points between P5 and P6, may be omitted.

According to the first to fourth embodiments, in the interface layer formation step, $N_2$ gas is used as a carrier gas for PET gas, but another inactive gas, such as He, Ne, or Ag gas, may be used as the carrier gas in place of an inactive gas, $O_2$ gas may be used as the carrier gas, resulting in the same process gases as in the main layer formation step. Furthermore, the material for tantalum is not limited to PET, but may be another organic tantalum.

FIG. 7 is a time chart showing an MOCVD method of a tantalum oxide film according to a fifth embodiment of the present invention. The fifth embodiment is characterized in that a formation stage of a tantalum oxide film is followed by a reformation step and a crystallization step sequentially performed in the same process container 20. In FIG. 7, steps from a time point P1 to a time point P7 are the same as those of the first embodiment shown in FIG. 2. However, in place of the first embodiment, it is possible to use the steps from the time point P1 to the time point P7 of the second embodiment shown in FIG. 4, the third embodiment shown in FIG. 5, or the fourth embodiment shown in FIG. 6.

When the formation stage of a tantalum oxide film is finished (the time point P7), the supply of PET gas and so forth is stopped. Then, an $N_2$ purge step is conducted, i.e., $N_2$ gas is supplied into the process container 20, so that PET gas, i.e., the raw material gas, left in the atmosphere of the process container 20 is removed. At this time, the temperature in the process container 20 is maintained at 410° C., i.e., substantially the same temperature as the last step of the film formation stage, e.g., the main layer formation step. After the $N_2$ purge is finished (a time point P9), a reformation step is performed.

The reformation step employs a reformation gas, selected from the group consisting of ozone ($O_3$), oxygen radical (O*), a mixture of $H_2$ and $O_2$, a mixture of $H_2$ and $N_2O$, a mixture of $H_2$ and NO, a mixture of $NH_3$ and $O_2$, and a mixture of $O_3$ and $H_2$. The process temperature in the reformation step is set to be not more than the crystallization temperature of tantalum oxide, to maintain a non-crystalline state, i.e., an amorphous state, of tantalum oxide. Specifically, the temperature of the wafers W in this step is set to be in a range of from 300 to 600° C., preferably of from 400 to 450° C., and, for example, at the same temperature as the main layer formation step, e.g., about 410° C. The reformation process is performed for, e.g., about 3 minutes, so that C—C bonds or hydrocarbons contained in the tantalum oxide film are cut off and dissociated by ozone or oxygen radicals, and defects in the film are repaired.

After the reformation step is finished (a time point P10), an $N_2$ purge step is conducted, i.e., $N_2$ gas is supplied into the process container 20, so that the reformation gas, such as ozone, left in the atmosphere of the process container 20 is removed. After the $N_2$ purge is finished (a time point P11), the temperature of the wafers W is raised to a temperature not less than the crystallization temperature of tantalum oxide (a time point P12), and a crystallization step is performed.

In the crystallization step, the temperature of the wafers W is set to be in a range of from 500 to 750° C., preferably of from 675 to 750° C., and, for example, at about 700° C. At this time, an inactive gas, such as $N_2$ gas or Ar gas, is supplied into the process container 20, with its flow rate being controlled. The crystallization step is performed for a predetermined period of time, e.g., about 3 minutes, to turn the tantalum oxide film from an amorphous state into a crystalline state. In this step, an inactive gas, such as $N_2$ gas or Ar gas, is used as a process gas where an MIM (Metal Insulator Metal) structure is fabricated, but $O_2$ or $O_3$ gas may be used as a process gas where an MIS (Metal Insulator Semiconductor) structure is fabricated.

After the crystallization step is finished (a time point P13), the temperature of the wafers w is lowered to a predetermined handling temperature of, e.g., about 200° C., with $N_2$ gas being supplied (a time point P14). Then, the pressure in the process container 20 is returned to the atmospheric pressure, and the wafer boat 44 along with the wafers W is unloaded from the process container 20.

According to the fifth embodiment, the formation stage of the tantalum oxide film is followed by the reformation step and the crystallization step sequentially performed in the same process container 20. As a result, it is possible to rapidly perform the whole process, thereby greatly improving the throughput.

FIG. 8 is a time chart showing an MOCVD method of a tantalum oxide film according to a sixth embodiment of the present invention. The sixth embodiment differs from the fifth embodiment in that a reformation step for a tantalum oxide film is performed again after a crystallization step. In the sixth embodiment, after the crystallization step is finished (a time point P13), the temperature of the wafers W is lowered not to a handling temperature, but to a reformation temperature higher than the handling temperature (a time point P15). The second reformation step is performed for a predetermined period of time, e.g., about 3 minutes, with the reformation temperature being maintained. At this time, the same reformation gas as in the first reformation step, such as ozone, oxygen radical, or oxygen and hydrogen radicals, is used. The process temperature in the second reformation step is set to be in a range of from 300 to 500° C., preferably of from 400 to 450° C., and, for example, at about 410° C.

When the second reformation step is finished (a time point P16), the supply of ozone is stopped. Then, the temperature of the wafers W is lowered to a predetermined handling temperature of, e.g., about 200° C., with $N_2$ gas being supplied (a time point P17). Then, the pressure in the process container 20 is returned to the atmospheric pressure, and the wafer boat 44 along with the wafers W is unloaded from the process container 20.

According to the sixth embodiment, the crystallization step of the tantalum oxide film is followed by the second reformation step. With this step, the bonds in the tantalum oxide film, to which impurities were coupled, but have been dissociated in the crystallization step, are coupled with oxygen, thereby improving the electric properties of the tantalum oxide film.

Figure 14:
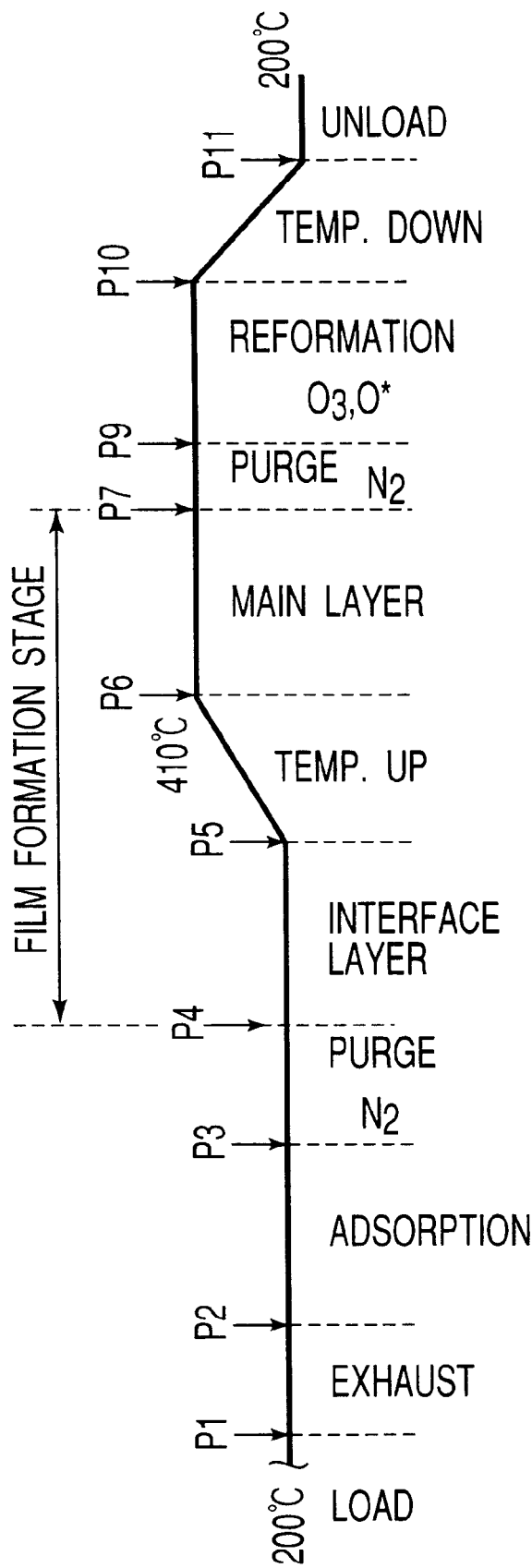
FIG. 14 is a time chart showing an MOCVD method of a tantalum oxide film according to a seventh embodiment of the present invention.

FIG. 14 is a time chart showing an MOCVD method of a tantalum oxide film according to a seventh embodiment of the present invention. The seventh embodiment differs from the fifth and sixth embodiments in that a formation stage of a tantalum oxide film is followed by a reformation step in the same process container 20, without a crystallization step. Specifically, when the formation stage of a tantalum oxide film is finished (the time point P7), an $N_2$ purge step is conducted, and a reformation step is then performed. The process conditions of the reformation step, such as a reformation gas, a process temperature, and a process time, are the same as in the fifth embodiment.

When the reformation step is finished (a time point P10), the supply of ozone is stopped. Then, the temperature of the wafers W is lowered to a predetermined handling temperature of, e.g., about 200° C., with $N_2$ gas being supplied (a time point P11). Then, the pressure in the process container 20 is returned to the atmospheric pressure, and the wafer boat 44 along with the wafers W is unloaded from the process container 20.

According to the seventh embodiment, the tantalum oxide film is reformed while the film maintains an amorphous state. As a result, it is possible to form an amorphous tantalum oxide film having excellent electric properties.

In the first to seventh embodiments, the temperature of the process container 20 is set at 200° C., when the wafers W are loaded and unloaded to and from the process container 20. However, this temperature is not limited to 200° C., but may be set at a temperature of from 200 to 350° C.

Figure 9A:
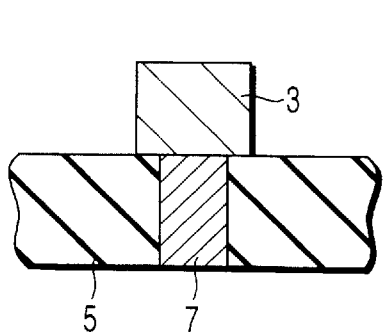
FIGS. 9A, 9B, and 9C are sectional views showing steps of forming the insulating film of tantalum oxide of a capacitor, which has an MIM (Metal Insulator Metal) structure, by an MOCVD method according to an embodiment of the present invention.
Figure 9B:
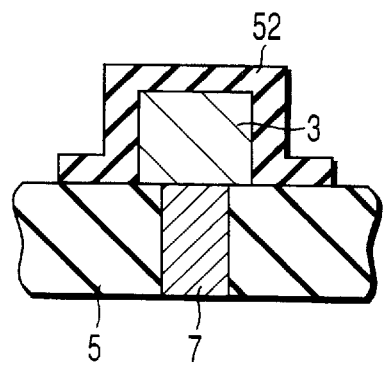
Figure 9C:
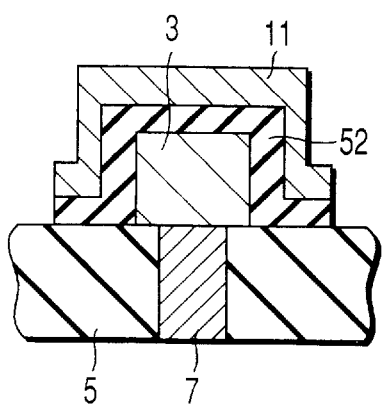

FIGS. 9A to 9C are sectional views showing steps of forming the insulating film of tantalum oxide of a capacitor, which has an MIM structure, by an MOCVD method according to an embodiment of the present invention.

As shown in FIG. 9A, a lower electrode 3 made of, e.g., ruthenium, for the capacitor is disposed on an inter-level insulating film 5 made of, e.g., $SiO_2$. The lower electrode 3 is connected to a diffusion layer (not shown) below it through a plug 7 made of, e.g., tungsten. As shown in FIG. 9B, a tantalum oxide film 52 is deposited as a capacitor insulating film on the lower electrode 3 and the inter-level insulating film 5. In order to form the film 52, a method according to any one of the first to seventh embodiments is used. Specifically, as shown in FIGS. 3A to 3C, an interface layer 50 is first deposited by an interface layer formation step, and a main layer 51 is then deposited thereon by a main layer formation step, thereby forming the tantalum oxide film 52. Then, as shown in FIG. 9C, an upper electrode 11 is formed on the tantalum oxide film 52.

Since the interface layer 50 is first deposited in the formation of the tantalum oxide film 52, there is no incubation time, i.e., no time lag in film formation. Consequently, the tantalum oxide film is deposited to have a thickness on the lower electrode 3, the same as that on the inter-level insulating film 5. In other words, the tantalum oxide film 52 is formed to have a uniform thickness without reference to underlying layers. As a result, when a voltage is applied across the electrodes 3 and 11 of the device shown in FIG. 9C, the device shows excellent electric characteristics, for example, because there is no recess 9 as shown in FIGS. 13A to 13C.

Where the formation stage of a tantalum oxide film is followed by a reformation step and a crystallization step sequentially performed in the same process container, it is possible to improve the throughput of the whole process, and to improve the electric properties of the tantalum oxide film. Note that, although the capacitor shown in FIG. 9C has an MIM structure, the present invention is applicable to the insulating film of a capacitor having an MIS structure.

Figure 10:
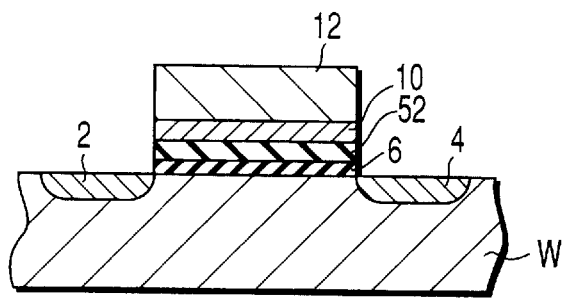
FIG. 10 is a sectional view showing a transistor, which employs a tantalum oxide film as the gate insulating film.

FIG. 10 is a sectional view showing a transistor, which employs a tantalum oxide film as the gate insulating film. The present invention is applicable to the case of forming this gate insulating film.

As shown in FIG. 10, a source 2 and a drain 4 are formed in the surface of a semiconductor wafer W made of, e.g., silicon. On the surface between the source and drain 2 and 4, an underlying layer 6, a tantalum oxide film 52 functioning as the gate insulating film, a barrier metal layer 10, and a gate electrode 12 are stacked in this order. The underlying layer 6 consists essentially of any one of silicon oxide (SiOx), silicon nitride (SiNx), and a mixture of them (SiOxNy). The barrier metal layer 10 is made of, e.g., TiN, to prevent the tantalum oxide film 52 and the gate electrode 12 from reacting with each other. The gate electrode 12 is made of Al (aluminum) or W (tungsten).

In order to form the film 52, a method according to any one of the first to seventh embodiments is used. Specifically, as shown in FIGS. 3A to 3C, an interface layer 50 is first deposited by an interface layer formation step, and a main layer 51 is then deposited thereon by a main layer formation step, thereby forming the tantalum oxide film 52. As a result, the tantalum oxide film 52 is formed to have a uniform thickness, because there is no incubation time, i.e., no time lag in film formation.

The present invention may be applied to an MOCVD apparatus of the batch type with a process container having a double-tube structure. The present invention may be applied to an MOCVD apparatus of the single-substrate-processing type. Furthermore, the present invention may be applied to a target substrate other than a semiconductor wafer, such as an LCD substrate, or a glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An MOCVD method of forming a tantalum oxide film on a target substrate in an airtight process container of a semiconductor processing system, comprising:

a step of preparing first and second materials consisting essentially of one and the other, respectively, of an oxidizing agent and an organic tantalum, and third and fourth materials consisting essentially of one and the other, respectively, of an oxidizing agent and an organic tantalum;

an adsorption step of forming a state where the first material is adsorbed on a surface of the target substrate placed in the process container;

a first layer formation step of supplying the second material in a gaseous state into the process container, and causing the first material adsorbed on the surface of the target substrate and the second material to react with each other, thereby forming a first layer consisting essentially of tantalum oxide on the target substrate, wherein the target substrate is set at a temperature of from 200 to 350° C. in the first layer formation step; and a second layer formation step, after the first layer formation step, of supplying the third and fourth materials in gaseous states into the process container, and causing the third and fourth materials to react with each other on the target substrate, thereby forming a second layer consisting essentially of tantalum oxide on the first layer, so that the tantalum oxide film comprises first and second layers.

2. The method according to claim 1, wherein the adsorption step comprises a step of supplying the first material in a gaseous state into the process container to cause the first material to be adsorbed on the surface of the target substrate.

3. The method according to claim 2, further comprising a step of purging the process container with an inactive gas after the adsorption step to remove the first material from an atmosphere in the process container.

4. The method according to claim 2, wherein the first and second materials are supplied into the process container from nozzles independent of each other.

5. The method according to claim 1, wherein the oxidizing agent used as one of the third and fourth materials has an oxidizing power lower than that of the oxidizing agent used as one of the first and second materials, the organic tantalum used as the other of the third and fourth materials is the substantially the same material as the organic tantalum used as the other of the first and second materials, and the target substrate is set at a temperature of from 350 to 500° C. in the second layer formation step.

6. The method according to claim 1, wherein the third and fourth materials are supplied into the process container at substantially the same time from nozzles independent of each other, in the second layer formation step.

7. The method according to claim 1, wherein the oxidizing agent used as one of the first and second materials is selected from the group consisting of $H_2O$, $H_2O_2$, $O_3$, oxygen radical, a mixture of $H_2$ and $O_2$, a mixture of $H_2$ and $N_2O$, a mixture of $H_2$ and NO, a mixture of $NH_3$ and $O_2$, and a mixture of $O_3$ and $H_2$.

8. The method according to claim 5, wherein the oxidizing agent used as one of the third and fourth materials is selected from the group consisting of $O_2$, $O_3$, and $H_2O$.

9. The method according to claim 1, wherein the adsorption step comprises a step of supplying moisture on the surface of the target substrate, before placing the target substrate in the process container, to cause the first material consisting essentially of an oxidizing agent to be adsorbed on the surface of the target substrate.

10. The method according to claim 1, further comprising a reformation step of reforming the first and second layers in the process container after the second layer formation step, wherein the target substrate is set at a temperature of from 300 to 600° C. in the reformation step.

11. The method according to claim 10, further comprising a crystallization step of crystallizing the first and second layers in the process container after the reformation step, wherein the target substrate is set at a temperature of from 500 to 750° C. in the crystallization step.

12. The method according to claim 11, further comprising a second reformation step of further reforming the first and second layers in the process container after the crystallization step, wherein the target substrate is set at a temperature of from 300 to 600° C. in the second reformation step.

13. The method according to claim 2, wherein the first and third materials are substantially the same as each other, while the second and fourth materials are substantially the same as each other, and the second layer formation step comprises a step of substantially repeating the adsorption step and the first layer formation step.

14. The method according to claim 1, wherein the first layer is formed on an underlying layer disposed on the target substrate, and the underlying layer comprises a surface consisting essentially of any one of silicon oxide, silicon nitride, and a mixture of them.

15. An MOCVD method of forming a tantalum oxide film on a target substrate in an airtight process container of a semiconductor processing system, comprising:

a step of preparing first and second materials consisting essentially of one and the other, respectively, of an oxidizing agent and an organic tantalum, and third and fourth materials consisting essentially of one and the other, respectively, of an oxidizing agent and an organic tantalum;

an adsorption step of supplying the first material in a gaseous state into the process container to cause the first material to be adsorbed on a surface of the target substrate;

a purge step of purging the process container with an inactive gas after the adsorption step to remove the first material from an atmosphere in the process container;

a first layer formation step, after the purge step, of supplying the second material in a gaseous state into the process container, and causing the first material adsorbed on the surface of the target substrate and the second material to react with each other, thereby forming a first layer consisting essentially of tantalum oxide on the target substrate, wherein the target substrate is set at a temperature of from 200 to 350° C. in the first layer formation step; and a second layer formation step, after the first layer formation step, of supplying the third and fourth materials in gaseous states into the process container, and causing the third and fourth materials to react with each other on the target substrate, thereby forming a second layer consisting essentially of tantalum oxide on the first layer, so that the tantalum oxide film comprises first and second layers, wherein the third and fourth materials are supplied into the process container at substantially the same time from nozzles independent of each other, in the second layer formation step.

16. The method according to claim 15, wherein the oxidizing agent used as one of the third and fourth materials has an oxidizing power lower than that of the oxidizing agent used as one of the first and second materials, the organic tantalum used as the other of the third and fourth materials is the substantially the same material as the organic tantalum used as the other of the first and second materials, and the target substrate is set at a temperature of from 350 to 500° C. in the second layer formation step.

17. The method according to claim 16, wherein the oxidizing agent used as one of the first and second materials is selected from the group consisting of $H_2O$, $H_2O_2$, $O_3$, oxygen radical, a mixture of $H_2$ and $O_2$, a mixture of $H_2$ and $N_2O$, a mixture of $H_2$ and NO, a mixture of $NH_3$ and $O_2$, and a mixture of $O_3$ and $H_2$.

18. The method according to claim 17, wherein the oxidizing agent used as one of the third and fourth materials is selected from the group consisting of $O_2$, $O_3$, and $H_2O$.

19. The method according to claim 15, further comprising a reformation step of reforming the first and second layers in the process container after the second layer formation step, wherein the target substrate is set at a temperature of from 300 to 600° C. in the reformation step.

20. The method according to claim 19, further comprising a crystallization step of crystallizing the first and second layers in the process container after the reformation step, wherein the target substrate is set at a temperature of from 500 to 750° C. in the crystallization step.

21. The method according to claim 20, further comprising a second reformation step of further reforming the first and second layers in the process container after the crystallization step, wherein the target substrate is set at a temperature of from 300 to 600° C. in the second reformation step.

22. The method according to claim 15, wherein the first layer is formed on an underlying layer disposed on the target substrate, and the underlying layer comprises a surface consisting essentially of any one of silicon oxide, silicon nitride, and a mixture of them.

* * * * *